United States Patent
Baer

(10) Patent No.: US 7,051,802 B2
(45) Date of Patent: May 30, 2006

(54) METHOD AND APPARATUS FOR COOLING ELECTRONIC ENCLOSURES

(75) Inventor: Daniel B. Baer, Delaware, OH (US)

(73) Assignee: Liebert Corp., Columbus, OH (US)

( * ) Notice: Subject to any disclaimer, the term of this patent is extended or adjusted under 35 U.S.C. 154(b) by 0 days.

(21) Appl. No.: 09/814,495

(22) Filed: Mar. 21, 2001

(65) Prior Publication Data

US 2001/0042616 A1    Nov. 22, 2001

Related U.S. Application Data

(60) Provisional application No. 60/190,881, filed on Mar. 21, 2000.

(51) Int. Cl.
*G05D 23/00* (2006.01)
*H05K 5/00* (2006.01)

(52) U.S. Cl. .................... 165/299; 165/80.3; 165/80.4; 62/259.2; 454/184; 361/696

(58) Field of Classification Search ............... 165/80.3, 165/80.4, 80.5, 299; 62/259.2; 454/184; 236/49.3; 361/699, 696
See application file for complete search history.

(56) References Cited

U.S. PATENT DOCUMENTS

| | | | |
|---|---|---|---|
| 3,253,646 A * | 5/1966 | Koltuniak et al. .......... 165/299 |
| 3,317,798 A | 5/1967 | Chu et al. .................... 317/100 |
| 3,334,684 A * | 8/1967 | Roush et al. .......... 62/259.2 X |
| 3,749,981 A * | 7/1973 | Koltuniak et al. .......... 361/696 |
| 3,754,596 A | 8/1973 | Ward, Jr. .................... 165/107 |
| 4,240,499 A * | 12/1980 | Kals ....................... 165/299 X |
| 4,315,300 A | 2/1982 | Parmerlee et al. .......... 361/382 |
| 4,495,780 A * | 1/1985 | Kaneko et al. ............... 62/229 |
| 4,514,746 A | 4/1985 | Lündqvist .................... 361/385 |
| 5,123,478 A * | 6/1992 | Hosaka ....................... 165/299 |
| 5,220,809 A * | 6/1993 | Voss ........................... 62/259.2 |

(Continued)

FOREIGN PATENT DOCUMENTS

DE    19804901 A    8/1999

(Continued)

OTHER PUBLICATIONS

Klingeberg, G.: "Kombination Spart Strom bei der Schaltschrank-klimatisierung" Elekotrotechnik, Vogel Verley K.G., Wurzburg DE, Nov. 5, 1998.

*Primary Examiner*—Ljiljana Ciric
(74) *Attorney, Agent, or Firm*—Locke Liddell & Sapp LLP

(57) ABSTRACT

A cooling apparatus and method, and more particularly, an apparatus and method for cooling the air exiting an electronics enclosure, are disclosed. Air is taken into the enclosure and heated by the electronic equipment. The air is then expelled through a heat exchanger, which cools the exiting air. The exiting air is cooled using an external source of cooling liquid, which absorbs the heat from the exiting air. This absorbed heat is then expelled from the liquid outside of the environment containing the enclosure. Cooling the air exiting the enclosure causes the enclosure to present a neutral heat load to a room containing such an enclosure. Cooling the exiting air obviates the necessity of increasing the room air conditioning capacity to account for the heat added to the room by the electronics within the enclosure. Further, the disclosed apparatus and method decrease the possibility of moisture condensation within the enclosure and also provide more efficient cooling than is available from prior art devices and techniques.

11 Claims, 7 Drawing Sheets

U.S. PATENT DOCUMENTS

| | | | |
|---|---|---|---|
| 5,467,607 A * | 11/1995 | Harvey | 62/259.2 X |
| 5,471,850 A * | 12/1995 | Cowans | 165/80.4 |
| 5,657,641 A * | 8/1997 | Cunningham et al. | 454/184 X |
| 5,673,029 A * | 9/1997 | Behl et al. | 454/184 X |
| 5,709,100 A * | 1/1998 | Baer et al. | 62/259.2 |
| 5,718,628 A * | 2/1998 | Nakazato et al. | 454/184 |
| 5,740,018 A * | 4/1998 | Rumbut, Jr. | 62/259.2 X |
| 6,026,891 A * | 2/2000 | Fujiyoshi et al. | 165/299 |
| 6,205,796 B1 * | 3/2001 | Chu et al. | 62/259.2 X |
| 6,208,510 B1 * | 3/2001 | Trudeau et al. | 165/80.3 |
| 6,299,526 B1 * | 10/2001 | Cowan et al. | 454/184 |
| 6,305,180 B1 | 10/2001 | Miller et al. | 62/259.2 |
| 6,881,141 B1 * | 4/2005 | Knight | 454/184 |
| 2002/0117291 A1 * | 8/2002 | Cheon | 165/80.4 |

FOREIGN PATENT DOCUMENTS

GB    2 113 012 A    7/1983

* cited by examiner

METHOD AND APPARATUS FOR COOLING ELECTRONIC ENCLOSURES

CROSS-REFERENCE TO RELATED APPLICATIONS

This application claims the benefit of U.S. Provisional application No. 60/190,881, filed Mar. 21, 2000.

BACKGROUND OF THE INVENTION

With the expansion of telecommunication and computer technology, increasing amounts of electronic equipment are required at various commercial and business facilities. To facilitate interconnection and access to such equipment, it is typically installed in a common room. Further, technological advancements are permitting more and more electronic equipment to be fit into increasingly smaller spaces. These forces are combining to produce relatively dense electronic installations that generate increasing amounts of heat. For such equipment to operate properly, and to maintain comfort for persons operating and working on such equipment, it is necessary to provide a relatively stable and comfortable temperature and humidity. This has typically been accomplished through the use of air conditioning.

As the density of electronic equipment has increased, it has become increasingly difficult to remove the heat introduced by the electronics from the rooms where such equipment is operated using the conventional room air conditioning alone. It has therefore become necessary to install additional localized cooling for enclosures containing electronic equipment that will remove the heat generated by the electronic equipment from the room, thereby minimizing or eliminating the heat load on the air conditioning equipment.

SUMMARY OF THE INVENTION

The present invention is an apparatus and method for removing heat generated by the electronics within an enclosure from the room containing such enclosure, thereby reducing or eliminating the heat load from the conventional room air conditioning system. In fact, using the present invention it is possible to supplement the cooling capacity of the room air conditioning system to promote efficient operation.

The principle of operation of the present system is as follows: Air from the computer room at the ambient temperature and humidity is taken into the enclosure and heated by the electronic equipment. The air is then expelled through a heat exchanger, which cools the air back to the ambient temperature. The exiting air is cooled using an external source of chilled water, glycol or a suitable dielectric fluid, which is typically readily available in commercial installations. By returning the air exiting the enclosure to the ambient temperature in the room, the load on the room air conditioning is reduced or eliminated. Furthermore, the cooling fluid provides a more efficient heat transfer medium for removing heat from the room than the room air, as would be the case with a conventional prior art cooling system.

In accordance with one aspect of the present invention, there is provided a cooling system for an enclosure. The enclosure contains equipment that produces heat and is disposed in a room having ambient air. The cooling system includes a heat exchanger attached to the enclosure. The room air enters the enclosure and absorbs heat from the equipment in the enclosure. The heat exchanger absorbs heat from the air and returns the air to the room at substantially the same ambient conditions of the ambient air in the room.

In accordance with another aspect of the present invention, there is provided a mechanism for moving air from the enclosure, through the heat exchanger, and back into the room.

In accordance with one aspect of the present invention, there is provided an enclosure in a computer room. The enclosure contains electronic equipment that produces a heat load. The enclosure includes an inlet for the ambient air from the computer room and an outlet for the heated air in the enclosure. The air absorbs the heat load from the electronic equipment. A heat exchanger adjacent to the outlet of the enclosure absorbs the heat load from the air in the enclosure. The air returns to the computer room at substantially the same ambient conditions as the ambient air in the computer room.

In accordance with one aspect of the present invention, there is provided a method for cooling an enclosure in a computer room. The enclosure contains electronics that produce a heat load. The method includes absorbing the heat load of the electronics by passing the air from the computer room over the electronics in the enclosure. The method further includes absorbing the heat from the heated air by passing the heated air through a heat exchanger. The heat exchanger expels the absorbed heat outside the computer room, while returning the cooled air to the computer room.

In accordance with one aspect of the present invention, there is provided a cooling apparatus for an enclosure disposed in a computer room. The enclosure contains equipment producing heat. The cooling system includes a rack mount in the enclosure. An airflow mechanism is installed in the enclosure, which draws air through the enclosure where the air absorbs heat from the equipment. A heat exchanger installs in the rack mount. The heat exchanger is in fluid association with an external cooling source outside the computer room. The heat exchanger absorbs heat from the air passing through the heat exchanger. The enclosure, therefore, presents a small to non-existent heat load to the computer room in which it is disposed.

BRIEF DESCRIPTION OF THE DRAWINGS

The foregoing, the preferred embodiment, and other aspects of the present invention will be best understood with reference to the detailed description of specific embodiments of the invention, which follows, when read in conjunction with the accompanying drawings, in which.

Figure 1:
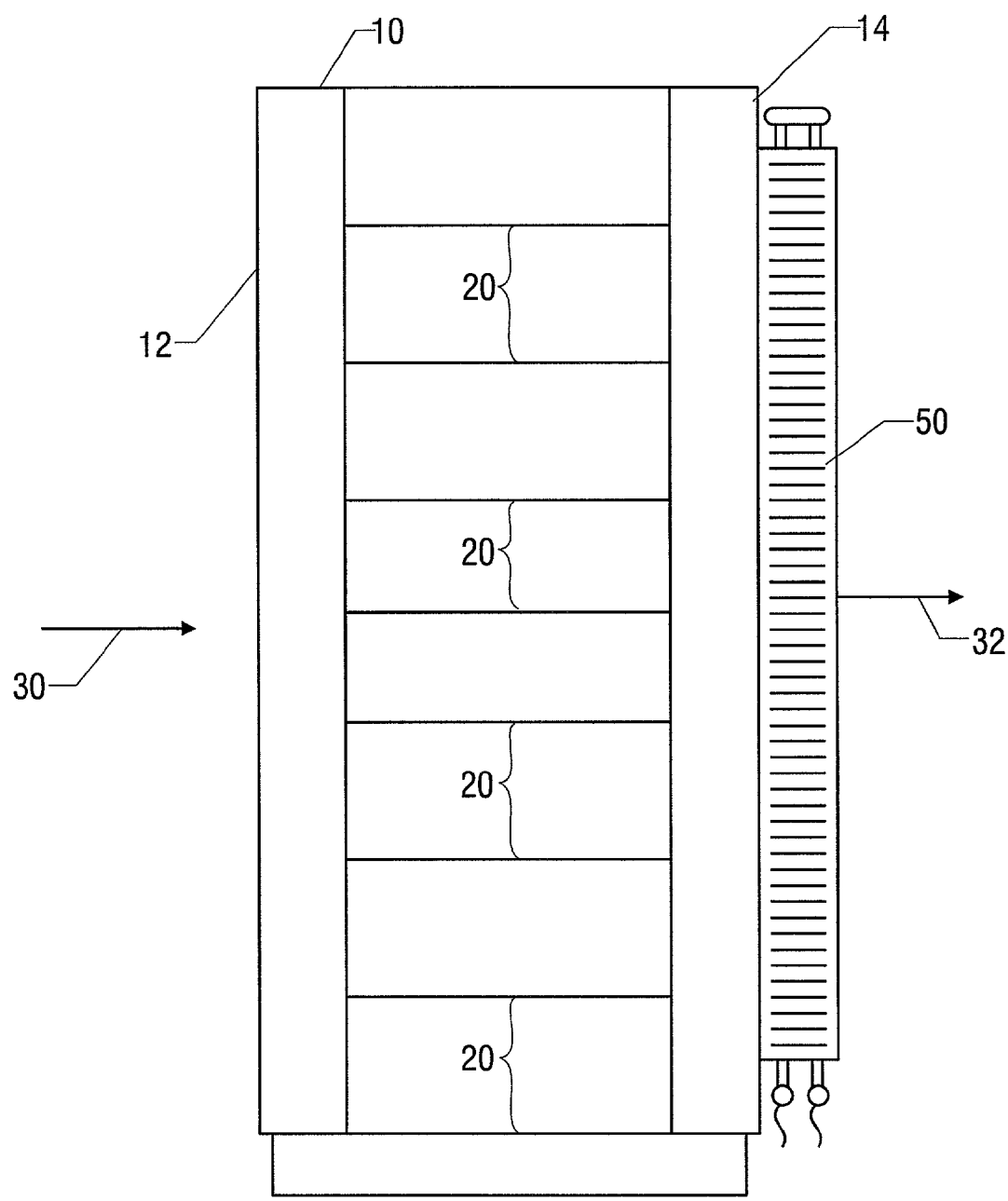
FIG. 1 shows a side view of an electronic equipment enclosure and cooling system in accordance with the present invention.

While the present invention is susceptible to various modifications and alternative forms, specific embodiments are shown by way of example in the drawings and are described in detail herein. However, it should be understood that the invention is not limited to the particular forms disclosed. Rather, the invention includes all modifications, equivalents and alternatives within the scope of the appended claims.

DESCRIPTION OF ILLUSTRATIVE EMBODIMENTS

An apparatus in accordance with the present invention is illustrated in FIG. 1. Electronic equipment, such as computer or telecommunication devices, is housed in a rack enclosure 10. Rack enclosure 10 contains a plurality of equipment mounting racks 20. Mounting racks 20 hold various computer and electronic equipment. Cooling fans integral to the computer equipment draw air 30 from the room, through the front 12 of enclosure 10. The air passes over the electronic equipment mounted in racks 20 and absorbs the heat generated by the electronics. The air 32 flows out the back 14 of enclosure 10 and back into the computer room.

Because the air used to cool the electronic equipment is returned to the room, the room air conditioning equipment must have adequate capacity to absorb the heat rejected to the room air by the computer equipment. The power dissipation of a typical rack system in use today is approximately 8 kW. However, with the trend of increasingly smaller and faster computer and electronic devices, it is anticipated that a typical rack system will dissipate 15 kW of heat within the next few years. Given the number of such rack systems installed in computer rooms, it is becoming increasingly difficult to cool the room air sufficiently to absorb the heat produced by the electronic equipment.

It is therefore preferable to have a means of cooling that does not reject heat into the computer room, such as the present invention. Turning again to FIG. 1, heat exchanger 50 is mounted on the rear 40 of rack enclosure 10. As discussed above, air 30 is drawn from the room through the front 30 of rack enclosure 10. The air passes over the electronic equipment mounted in racks 20 and through heat exchanger 50. Heat exchanger 50 absorbs the heat added to the air by the electronic equipment, thereby eliminating the additional heat load to the room air conditioning system. The air 32 then returns to the computer room.

In a typical embodiment of the present invention, the ambient air in the computer room would be at a temperature of 75 degrees Fahrenheit. The rack mounted electronic equipment would add heat to this air raising its temperature to a typical value of 95 degrees Fahrenheit. To present a neutral heat load to the computer room air conditioning system, the heat exchanger must absorb all of the heat added to the air, thereby reducing its temperature to the 75 degrees ambient temperature of the computer room. This heat is then rejected into a source of chilled water, glycol, dielectric fluid or other fluid, which is typically available in buildings where such equipment is housed.

It may be desirable to isolate the cooling fluid used in the cooling device of the present invention from the cooling fluid provided by the external source. For example, the building housing the rack cooler may use chilled water as a cooling fluid. It may then be desirable to use a different cooling fluid with different dielectric properties, within the present invention. The use of a fluid having different dielectric properties will prevent catastrophic damage to the electronic equipment in case of a leak. Furthermore, the amount of isolated cooling fluid required for the rack cooler is limited, meaning less fluid would escape if a leak were to occur.

Isolating the cooling fluid used in the present invention from the cooling fluid of the source may be readily accomplished using a fluid to fluid heat exchanger, as is known in the art. The fluid to fluid heat exchanger may use pumps, valves, sensors and controller to ensure the temperature exchange between the cooling fluid of the source and the cooling fluid in the rack cooler. Additionally, by isolating the cooling fluid used in the present invention, the pressure of the isolated cooling fluid may be controlled. The pressure of the isolated cooling fluid may be made equal to atmospheric pressure minus the head pressure of the cooling fluid. If a leak were to occur in the present invention, air would enter through the leak, and the isolated cooling fluid would be prevented from escaping.

Figure 2:
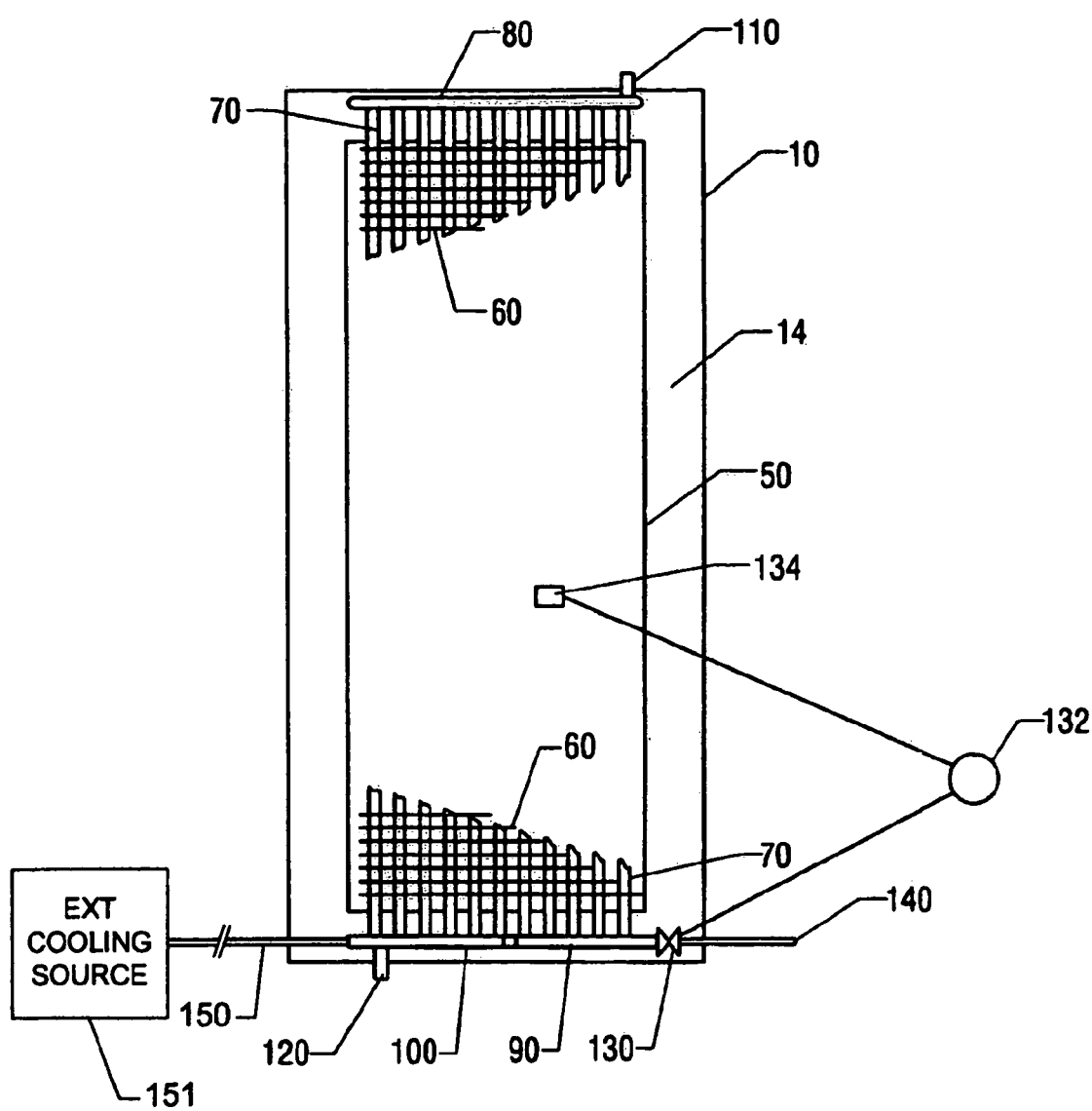
FIG. 2 shows the rear view of the electronics enclosure, which presents a face-on view of the cooling system of the present invention.

The construction of heat exchanger 50 is illustrated in FIG. 2. Heat exchanger 50 is mounted on the back of enclosure 14. The heat exchanger is made up of a number of cooling tubes 70 that pass through cooling fins 60. Chilled water, glycol, dielectric fluid or another cooling fluid from source 140 enters the heat exchanger through modulating valve 130. Modulating valve 130 is operated by a temperature controller 132 to ensure that the air exiting the heat exchanger is at the same temperature as the room temperature of the computer room in which the equipment is housed. Temperature controller 132 may have a temperature sensor 134 on the back of heat exchanger 50 to measure the temperature of the air leaving the heat exchanger. The chilled cooling fluid then passes into inlet header 90.

From inlet header 90, the chilled cooling fluid passes upward through cooling tubes 70, which are in thermal contact with fins 60. Air that has been heated by the electronic equipment is flowing through the heat exchanger in a direction parallel to the plane of the fins 60 and perpendicular to the cooling tubes 70. The fluid passing through tubes 70 absorbs heat from the air. The cooling fluid then reaches top header 80 at the top of the heat exchanger and returns downward through another set of cooling tubes 70. The fluid absorbs additional heat from the airflow across the electronic components and reaches the outlet header 100 located at the bottom of heat exchanger 50. The cooling fluid, now heated is returned through fluid return 150. The cooling fluid flows to an external cooling source 151 that rejects the heat absorbed by the fluid outside the computer room. The external cooling source 151 may be a chiller or a second heat exchanger. The chilled fluid is then returned to the inlet 140, operating the cycle continuously.

A preferred embodiment of the cooling system of the present invention includes vent 110 located at the top header 80 of heat exchanger 50. This vent provides a mechanism whereby the air present in the cooling tubes 70 may be expelled from the system when the heat exchanger is charged with cooling fluid. The preferred embodiment also includes drain 120, located at either the inlet header 90 or outlet header 100 at the bottom of heat exchanger 50. This drain provides means whereby the cooling fluid may be drained from the heat exchanger tubes 70 as required for maintenance purposes.

Figure 4:
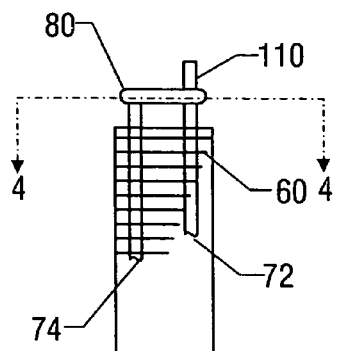
FIG. 4 illustrates a bottom view of the heat exchanger piping used in the present invention.
Figure 4:
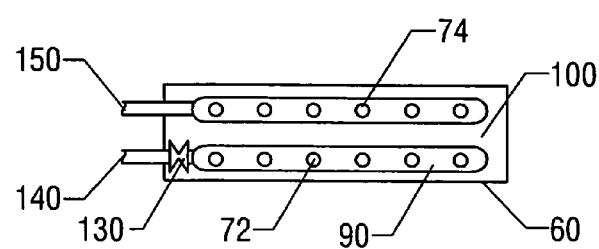
Figure 3:
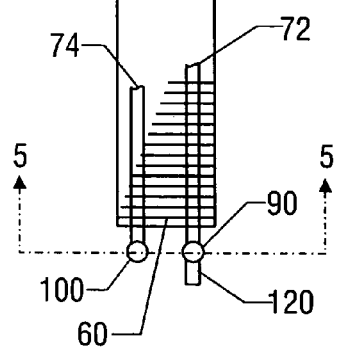
FIG. 3 shows an enlarged side view of a cooling system in accordance with the present invention.
Figure 5:
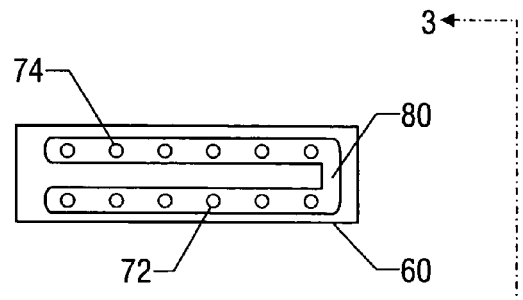
FIG. 5 shows a top view of the heat exchanger piping used in the present invention.

FIG. 3, in conjunction with FIG. 4 and FIG. 5, illustrates the flow of cooling fluid through the apparatus of the present invention. Turning to FIG. 4, a bottom view of the heat exchanger is shown. The cooling fluid enters the heat exchanger from cooling fluid source 140. The flow of cooling fluid is modulated by valve 130 to regulate the amount of cooling fluid passing through the exchanger, which in turn controls the amount of heat absorbed and the temperature of the exiting air. The cooling fluid then enters inlet header 90 and passes upward through cooling tubes 72.

Turning now to FIG. 3, a side view of the heat exchanger 5 is shown. The fluid passes upward through cooling tubes 72, which are in thermal contact with cooling fins 60. Airflow through the apparatus is in a direction from left to right in the plane of the page. The cooling fluid then reaches top header 80, which is more clearly illustrated by FIG. 5. In the top header of FIG. 5, the fluid comes up through cooling tubes 72 and flows around to pass downward through cooling tubes 74. Fluid flow is in a counter clockwise direction through top header 80, although the header could be constructed in various fashions. Furthermore, the device could be constructed without the top header, with the connection between the upward cooling tubes and the corresponding downward cooling tubes being made by a series of hairpin bends. Returning to FIG. 3, the cooling fluid passes downward through cooling tubes 72 and returns to outlet header 100, which is more clearly illustrated in FIG. 4. As can be seen, the cooling fluid passes through outlet header 100 to cooling fluid return piping 150.

In addition to providing a cooling means for electronic equipment that is heat neutral to the room air conditioning, the present invention has an additional advantage in that it prevents condensation on or near the electronic equipment. Prior art cooling systems for electronic enclosures cooled the air entering the enclosure, which then passed over the electronic equipment and was heated back to the room air temperature by the electronics.

It is well known to those skilled in the art that the amount of water that the air can hold decreases significantly with a decrease in temperature. For example, a typical computer room installation would have an ambient condition of 75 degrees Fahrenheit and a relative humidity of 50 percent. Using standard psychometric calculations, it can be shown that this corresponds to an absolute humidity of approximately 0.009 pounds of water per pound of air. Cooling this air to a temperature of 55 degrees Fahrenheit increases the relative humidity to 100 percent, meaning condensation is imminent. This condensation will take place inside the computer rack enclosure, which poses significant risk to the electronic equipment. Furthermore, if the enclosure is opened, the influx of warm, relatively moist air will virtually guarantee condensation on the electronic equipment.

Conversely, using the present invention, the ambient air enters the enclosure at a typical temperature of 75 degrees Fahrenheit and a typical relative humidity of 50 percent. The air is heated by the electronic components to a typical temperature of 95 degrees Fahrenheit. This decreases the relative humidity of the air to approximately 26 percent. When the heat is removed by the heat exchanger, the relative humidity again increases to a typical value of 50 percent. Because the air always contains a relatively low amount of water as compared to saturation, the possibility of condensation is virtually non-existent.

The cooling technique of the present invention has the added advantage of allowing the use of a relatively warmer cooling fluid. To efficiently transfer heat from the heated air to the cooling fluid, it is typically necessary to maintain a temperature differential of 10 degrees Fahrenheit or more between the lowest air temperature and the temperature of the cooling fluid. This temperature differential is required to achieve significant heat transfer between the heated air and the cooling fluid. In the typical prior art embodiment discussed above, this would require cooling fluid at an initial temperature of 45 degrees Fahrenheit to cool the entering 75 degrees Fahrenheit air to 55 degrees Fahrenheit. Conversely using a typical embodiment of the present invention, the cooling fluid temperature need only be approximately 65 degrees Fahrenheit. This increased temperature of the cooling fluid is advantageous in that it enables the mechanism for cooling the fluid to operate more efficiently and it also reduces the probability of condensation on any of the cooling fluid lines.

In another preferred embodiment of the present invention, a separate means may be provided to force air through the heat exchanger, which allows the cooling device of the present invention to absorb greater quantities of heat. As the required amount of heat absorption increases, it becomes necessary to increase the thickness of the heat exchanger, increasing the length of the air path through the cooling fins. This increased obstruction to air flow results in a greater air pressure drop across the heat exchanger. As the pressure drop increases, the velocity of the air decreases, ultimately reducing the amount of heat that the air can absorb from the electronic equipment. As a result, it is beneficial to provide a means of increasing airflow through the heat exchanger to supplement the air flow generated by the electronic equipment's integral cooling fans.

Various air flow means that may be added include centrifugal blowers, cross-flow blowers, axial fans, plug fans, and other equivalents that are known in the art. Each fan type has its own performance advantages and disadvantages. For example, construction using axial fans would be expensive to implement. Axial fans also run relatively slowly, thus limiting the airflow increase that can be obtained. Centrifugal blowers are relatively inexpensive to implement and relatively efficient. The airflow path of cross flow blowers minimizes the space required to generate proper airflow across the heat exchanger. Cross flow blowers are also fairly quiet and provide large air volume throughput at relatively low speeds. Plug fans, also known as backward curved motorized impellers, provide very low sound levels, which is important when numerous devices are to be installed in a single room. Plug fans also have very low power consumption levels and are relatively efficient to operate. Whatever the design of the fan, it is preferable to use multiple fans in each cooling device so that failure of any single fan will not compromise system performance.

Figure 6A:
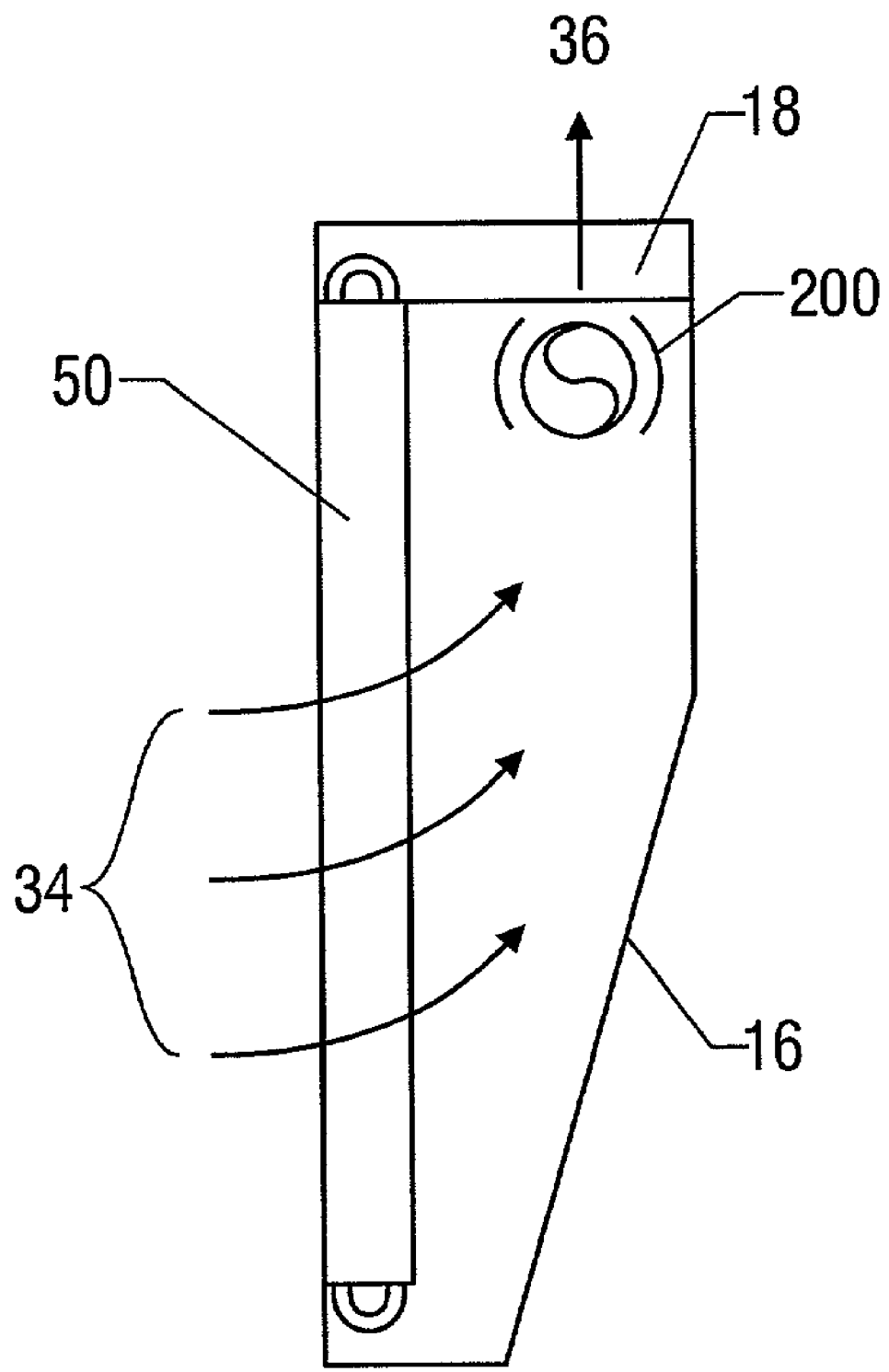
FIG. 6A–6B illustrate embodiments of the present invention, including an airflow inducing mechanism.

FIG. 6A illustrates an embodiment of the present invention, implementing an airflow means. A side view of heat exchanger 50 is shown attached to back 14 of enclosure 10. An extension or additional chamber 16 attaches to the back 14 and encompasses heat exchanger 50. Extension 16 has an outlet 18 for air. An air circulator or fan 200 situates within extension 16 and adjacent outlet 18. Drawn by fan 200, air 34 flows from within the enclosure and through heat exchanger 50 where cooled. Finally, cooled air 36 exits outlet 18 and returns to the room. It is understood that a number of air circulators, such as those described above, may sufficiently draw air through the heat exchanger, and therefore, selection of the appropriate mechanism lies within the discretion of one having ordinary skill in the art.

Figure 6B:
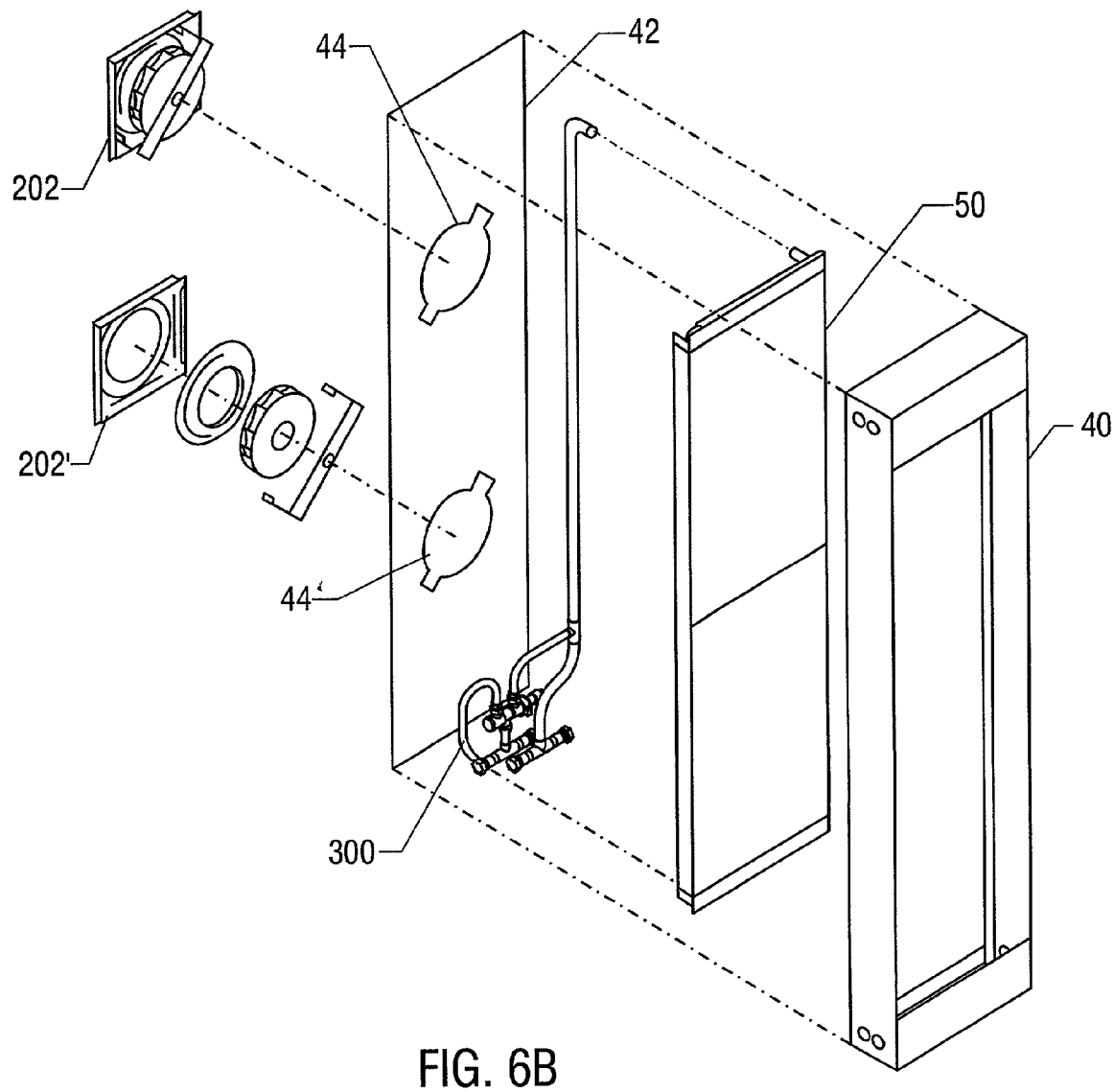

FIG. 6B illustrates an embodiment of a heat exchanger with fans according to the present invention. Heat exchanger 50 installs in an attachment enclosure 40. Necessary piping and valves 300, further described below, connect to heat exchanger 50. A panel 42 then attaches to attachment enclosure 40. Panel 42 has a plurality of openings 44, 44' to receive fans 202, 202'. The fans may be, for example, propeller or plug fans, as these fans present a thin profile for installing on panel 42. The attachment enclosure 40, panel 42, heat exchanger 50, piping 300 and fans 202, 202' then installs on a rack enclosure (not shown).

Figure 7:
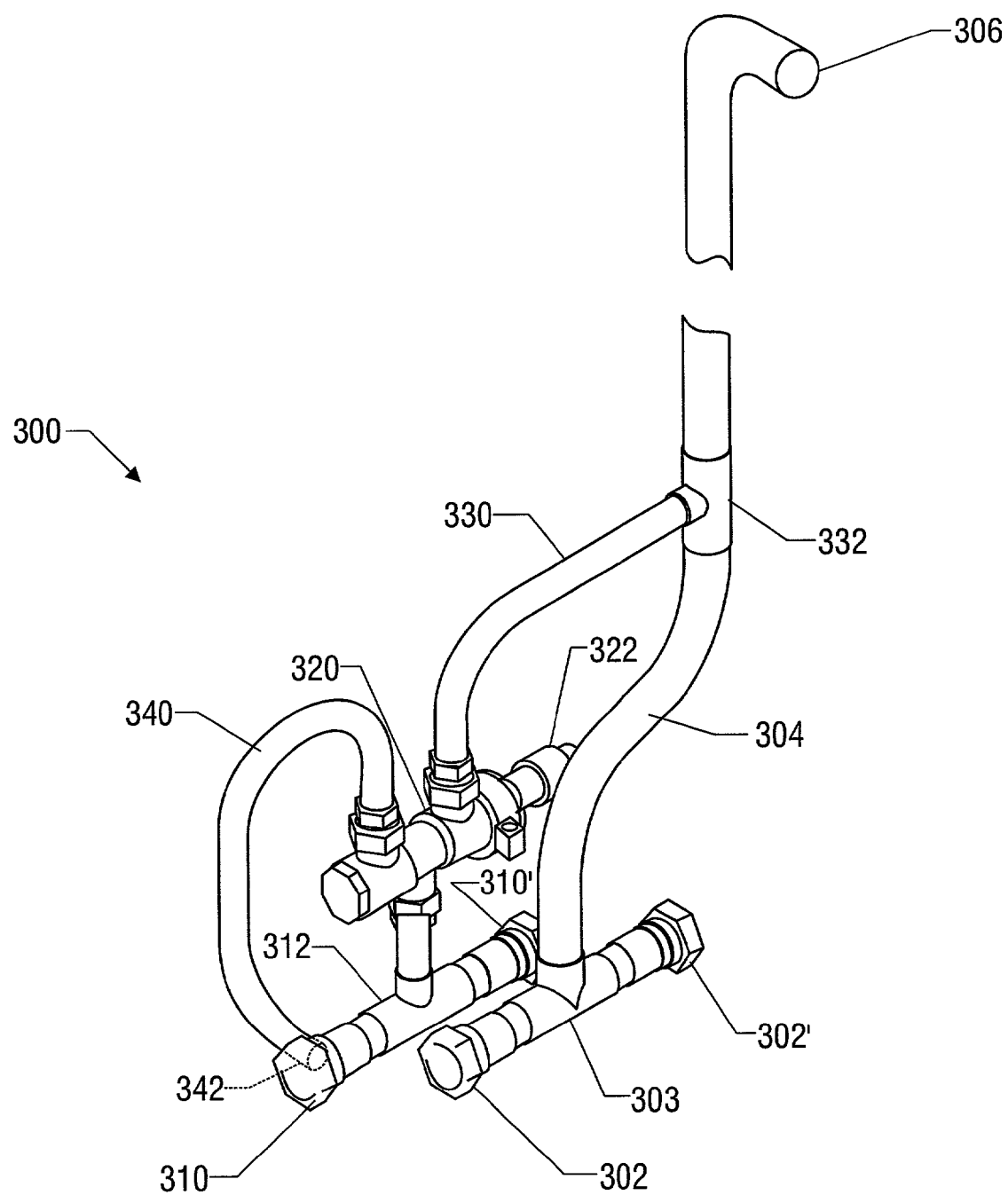
FIG. 7 illustrates an embodiment of a modulating valve and piping arrangement according to the present invention.

FIG. 7 illustrates an embodiment of a modulating valve and piping arrangement 300 according to the present invention. Adapters 302, 302' attach to an external cooling source (not shown). The external cooling source supplies cooling fluid, such as water, glycol or dielectric fluid, to the heat exchanger (not shown). A tee 303 connects adapters 302, 302' to supply line 304. Supply line 304 has connection end 306 that connects to the heat exchanger as shown in FIG. 6B.

After passing through the heat exchanger and absorbing heat, cooling fluid leaves the heat exchanger through return line 340. A return opening 342 on return line 340 connects to the heat exchanger and receives the heated cooling fluid. Return line 342 connects to one coupling of a modulating valve or thermostatic valve 320. Thermostatic valve 320 also has a second pipe, a supply pipe 330, attached. Supply pipe 330 connects the thermostatic valve to supply line 304.

Thermostatic valve 320 has a thermostatic operator 322 that changes the valve position according to temperature control. A temperature sensor and other required controls (not shown) operate thermostatic valve 320. The valve controls the flow of cooling fluid in the heat exchanger and ensures that the air exiting the heat exchanger is at the same temperature as the room temperature of the computer room in which the enclosure is housed. Thermostatic valve 320 attaches to a tee coupling 312 that connects the valve to adapters 310, 310'. Adapters 310, 310' connect to the external cooling source and returns cooling fluid to the external cooling source.

Figure 8:
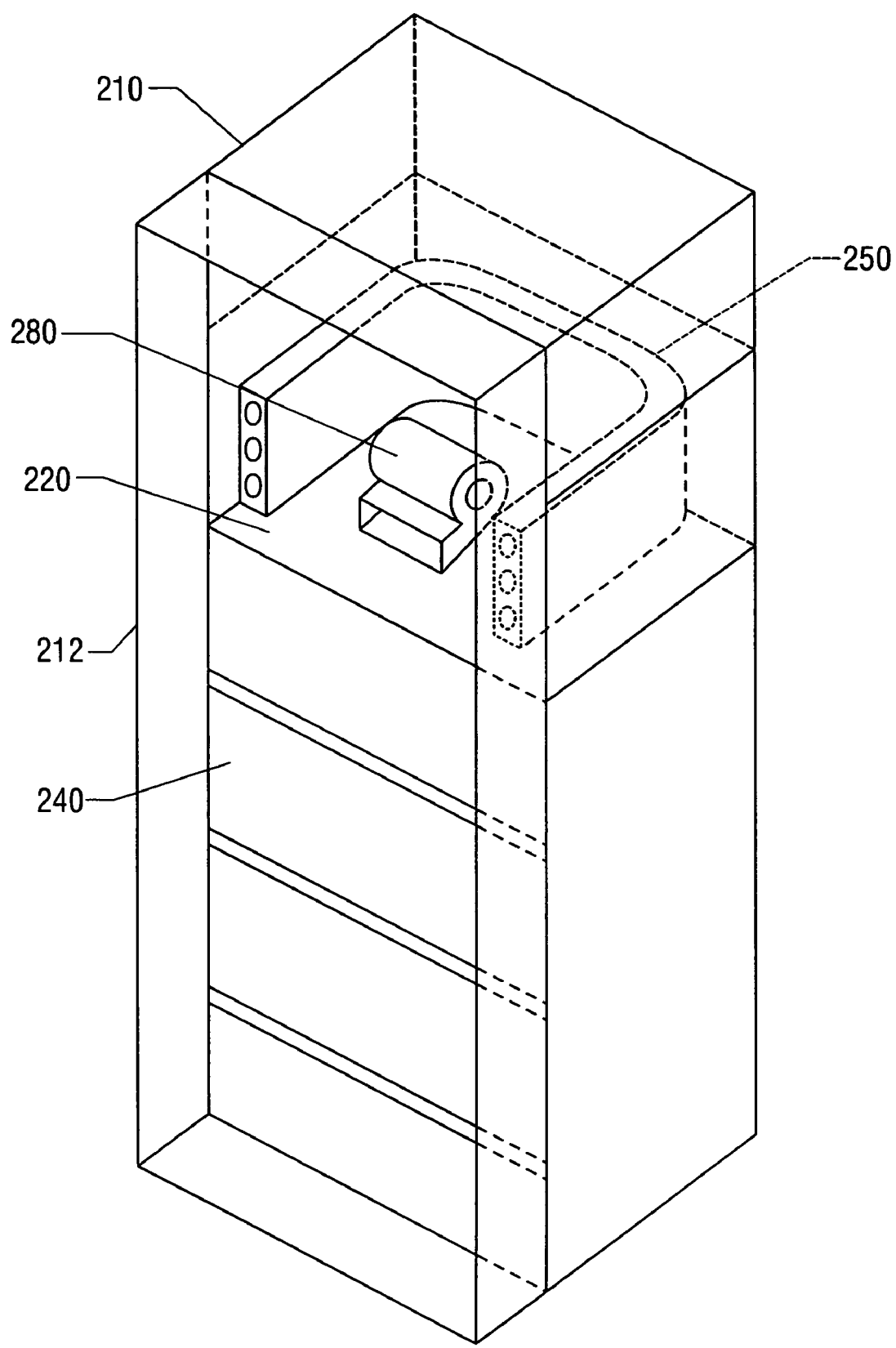
FIG. 8 illustrates another embodiment of the present invention.

Another embodiment of the invention is illustrated in FIG. 8. In this embodiment, cooling apparatus 250 is contained within the enclosure 210 and mounted on rack 220. The general principles of operation of this embodiment are substantially the same as the embodiments discussed above, however, the airflow path is different. In the airflow path of the present embodiment, air is drawn in through the front 212 of enclosure 210. After passing through electronics 240 and absorbing heat therefrom, the air passes through the interior of enclosure 210 and is drawn back through cooling apparatus 250. Cooling apparatus 250, which operates in the same manner as described for the previous embodiment absorbs the heat from the air flow and rejects this heat into the cooling fluid delivered to the external source (not shown). Blower 280 draws air through the cooling apparatus, which may be of the designs that are known in the art. The cooled air then returns to electronics 240 again traveling through enclosure 210.

In this embodiment, the cooling apparatus of the present invention allows the electronics enclosure 210 to present a neutral heat load to the computer room by keeping the heated air contained within the enclosure. The heat produced by electronic equipment 240 within enclosure 210 is ultimately rejected outside the room by the cooling fluid.

Additional modifications and adaptations of the present invention will be obvious to one of ordinary skill in the art, and it is understood that the invention is not to be limited to the particular illustrative embodiments set forth herein. It is intended that the invention embrace all such modified forms as come within the scope of the following claims.

What is claimed is:

1. A cooling system for an enclosure containing heat-producing equipment, said enclosure having an inlet allowing air from an environment containing the enclosure to enter the enclosure, the air from the environment being at a first temperature level and having a saturation temperature, the inlet being situated relative to the equipment such that the air passing therethrough to absorb heat from the equipment is increased to a second temperature level and thereafter exits the system through an outlet, the cooling enclosure comprising:
   a temperature sensor for measuring the temperature of the air exiting the enclosure;
   a controller operably connected to the temperature sensor;
   an external cooling source;
   an air-to-liquid heat exchanger positioned and adapted to remove the heat from the air exiting the enclosure, wherein the heat exchanger expels the heat to the external cooling source;
   the controller controlling liquid fluid flowing through the heat exchanger in response to the measured temperature to maintain the temperature of the air exiting the heat exchanger above the saturation temperature, thus preventing condensation.

2. The cooling system of claim 1, wherein the heat exchanger further comprises an air vent, whereby air present in the heat exchanger is expelled when the heat exchanger is charged with liquid.

3. The cooling system of claim 1, further comprising a fan situated to move air through the heat exchanger.

4. The cooling system of claim 3, wherein the fan is selected from the group consisting of a centrifugal blower, a cross-flow blower, an axial fan and a plug fan.

5. The cooling system of claim 3, wherein the heat exchanger and the fan are attachable to the enclosure.

6. The cooling system of claim 1, further comprising a valve regulating liquid flow through the heat exchanger.

7. The cooling system of claim 6, wherein the controller modulates the valve in response to the measured temperature of the air exiting the enclosure.

8. The cooling system of claim 7, wherein the heat exchanger cools the temperature of the air exiting the enclosure to equal the ambient temperature of the air in the environment containing the enclosure.

9. A cooling system for an enclosure containing heat-producing equipment, said enclosure having air passing therethrough to absorb heat from the equipment and thereafter exiting the system, the cooling system comprising:
   an external cooling source;
   an air-to-liquid heat exchanger positioned and adapted to remove the heat from the air exiting the enclosure, wherein the heat exchanger expels the heat to the external cooling source;
   a valve regulating liquid flow through the heat exchanger;
   a temperature sensor for sensing a temperature of air exiting the heat exchanger; and
   a temperature controller coupled to the sensor for modulating the valve in response to the sensed temperature of the air exiting the heat exchanger.

10. An enclosure containing heat-producing equipment, comprising:
   an air inlet for admitting air from an environment containing the enclosure, wherein the air absorbs heat from the equipment;
   an air outlet for expelling the heated air from the enclosure;
   an external cooling source;
   an air-to-liquid heat exchanger adjacent to the air outlet, the heat exchanger absorbing heat from the heated air exiting the enclosure and expelling the heat to the external cooling source using a cooling liquid as a heat transfer medium;

a modulating valve for regulating the cooling liquid flow through the heat exchanger;

a temperature sensor sensing the temperature of the air exiting the heat exchanger; and a temperature controller modulating the valve in response to the sensed temperature of the air exiting the heat exchanger.

11. A method for cooling an enclosure containing heat-generating equipment, the method comprising:

drawing air into the enclosure from an environment containing the enclosure;

passing the air in the vicinity of the heat-generating equipment to absorb heat from the equipment;

passing the heated air through an air-to-liquid heat exchanger in which a cooling liquid absorbs heat from the heated air;

controlling the flow of the cooling liquid through the air-to-liquid heat exchanger to maintain the air returning to the environment containing the enclosure at a temperature above the saturation temperature of the air in the environment containing the enclosure; and rejecting heat from the cooling liquid to outside of the environment containing the enclosure.

* * * * *